United States Patent [19]

Nogami et al.

[11] Patent Number: 4,769,792
[45] Date of Patent: Sep. 6, 1988

[54] SEMICONDUCTOR MEMORY DEVICE WITH VOLTAGE BOOTSTRAP

[75] Inventors: Kazutaka Nogami, Kawasaki; Takayasu Sakurai, Tokyo; Syuso Fujii, Kawasaki, all of Japan

[73] Assignee: Kabushiki Kaisha Toshiba, Kawasaki, Japan

[21] Appl. No.: 923,958

[22] Filed: Oct. 28, 1986

[51] Int. Cl.$^4$ .................. G11C 11/40; G11C 13/00
[52] U.S. Cl. ............................. 365/222; 365/203; 365/204
[58] Field of Search ............... 365/222, 189, 203, 204

[56] References Cited

PUBLICATIONS

Nakano et al., "A Sub-100 ns 256 K Dram with Open Bit Line Scheme," IEEE-JSSC, vol. SC 18, No. 5, pp. 452-456, Oct. 1983.

Primary Examiner—Terrell W. Fears
Attorney, Agent, or Firm—Finnegan, Henderson, Farabow, Garrett and Dunner

[57] ABSTRACT

Two or more voltage bootstrap circuits are included, and are sequentially operated. A continuous data write/read operation can be performed at a high speed. One of the two voltage bootstrap circuits is used for the data write/read operation and the other thereof is used for the refresh operation, thereby shortening the time required for refreshing.

18 Claims, 5 Drawing Sheets

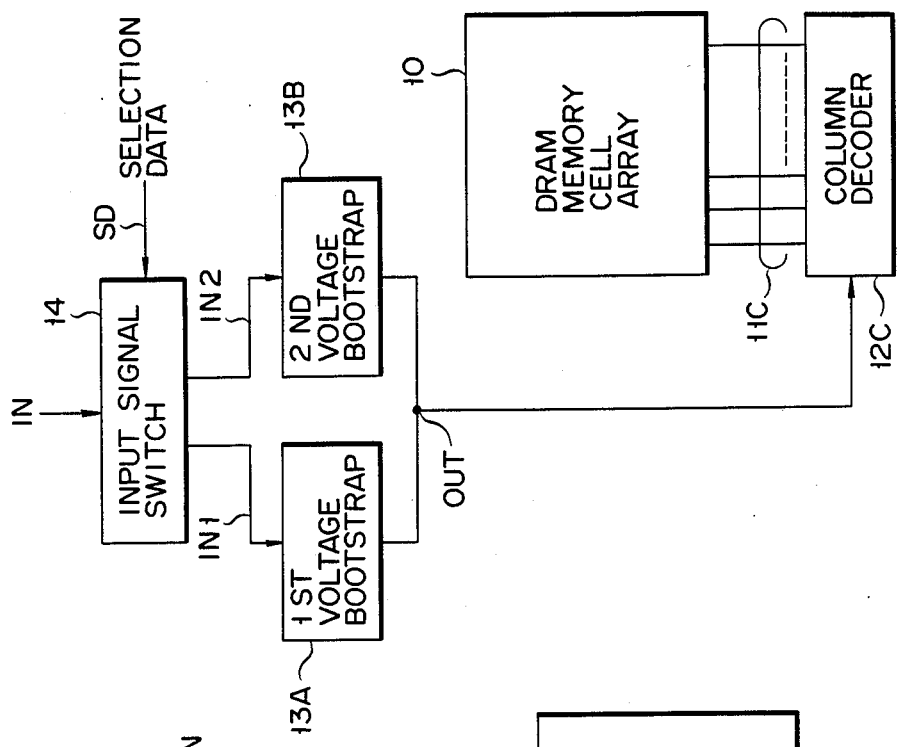
F I G. 4
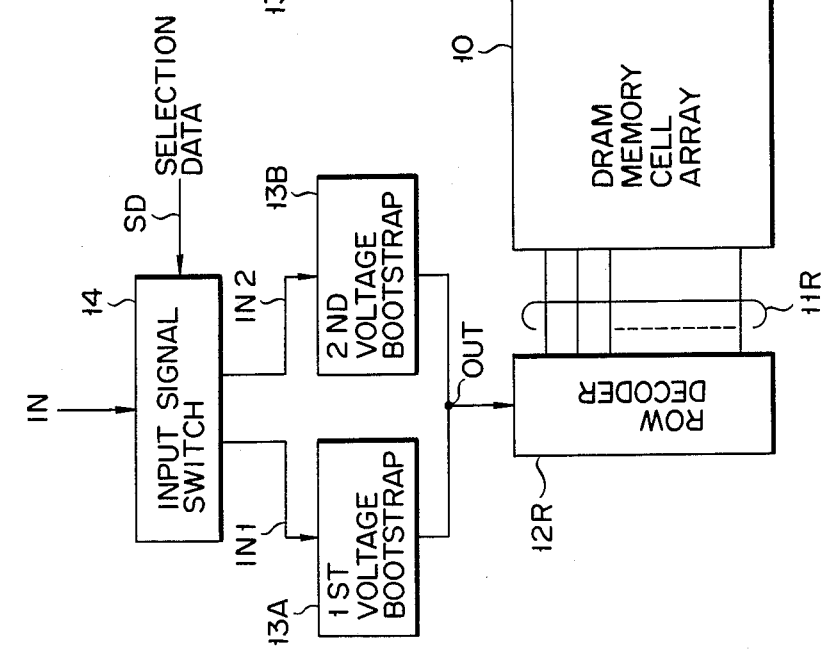
F I G. 5

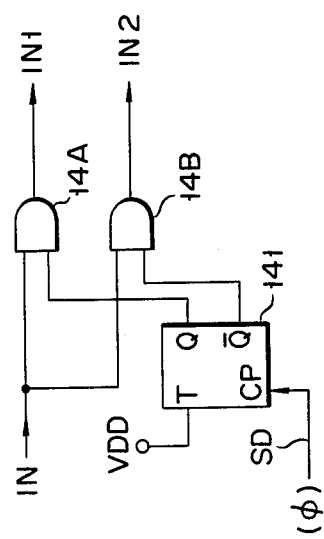
F I G. 7
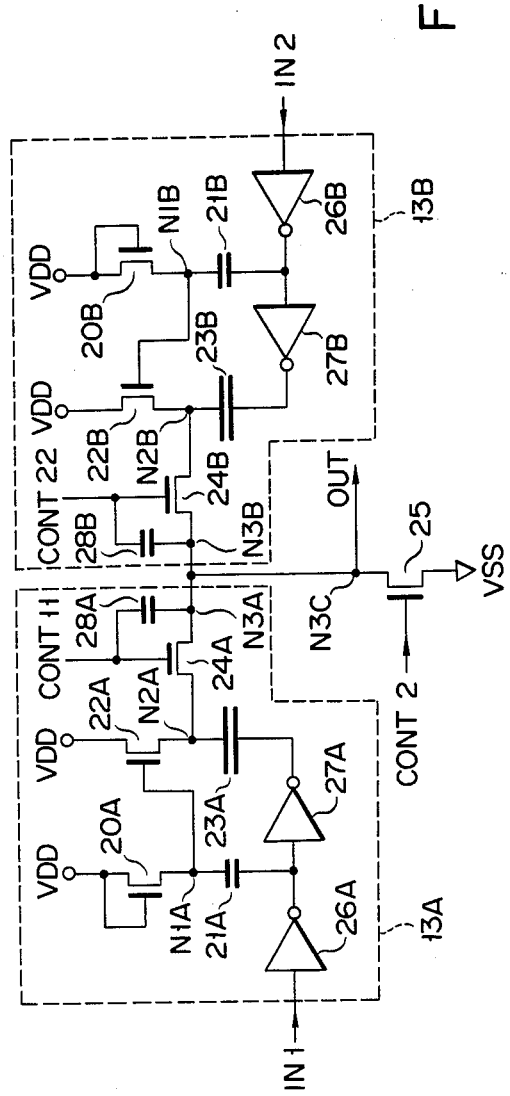
F I G. 6

SEMICONDUCTOR MEMORY DEVICE WITH VOLTAGE BOOTSTRAP

BACKGROUND OF THE INVENTION

The present invention relates to a semiconductor memory device which supplies, by means of a voltage bootstrap, a signal voltage higher than a power source voltage, to a selection line (a word or bit line) of a memory cell, when the memory cell is selected.

In a semiconductor memory device, particularly a dynamic RAM (Random Access Memory), a WRITE voltage for a memory cell must be sufficiently close to a power source voltage, in order to increase the operation speed and the time margin for reading data. For this purpose, in some semiconductor memory devices, a voltage bootstrap circuit is provided to output a signal voltage, higher than a power source voltage, to a selected word or bit line.

FIG. 1 is a block diagram showing a configuration of a conventional semiconductor memory device with such a voltage bootstrap circuit. The configuration of FIG. 1 is also shown in T. Nakano et al, "A Sub-100 ns 256K DRAM with Open Bit Line Scheme", IEEE Journal of Solid-State Circuits, Vol. SC-18, No. 5 (October, 1983), p. 453, FIG. 3. Pages 452 to 456 of this literature are incorporated in the present application.

Referring to FIG. 1, reference numeral 10 denotes a dynamic memory cell array having a plurality of memory cells each consisting of a selection MOS transistor and a capacitor for storing data. The memory cells in memory cell array 10 are connected to a plurality of word lines 11R, respectively. When lines 11R are driven, all the memory cells connected thereto are selected simultaneously. Reference numeral 12R denotes a row decoder for selecting word lines 11R in accordance with address signals. Row decoder 12R receives output signal OUT whose magnitude is increased, by voltage bootstrap circuit 13, to be higher than the power source voltage. Decoder 12R drives word line 11R, selected in accordance with an address signal, by signal OUT.

Voltage bootstrap circuit 13 receives a RAS (row address strobe) signal or a control signal for an auto-refresh operation, as input signal IN, and outputs signal OUT which is increased to be higher than the power source voltage when the level of input signal IN is changed.

Each of the memory cells in memory cell array 10 is connected, in a unit of a word line, to a corresponding one of a plurality of sense amplifiers (not shown), via a pair of bit lines. The sense amplifiers are connected to column decoders (not shown). The data stored in the memory cells, which are each connected to a specific word line 11R selected by row decoder 12R, are sensed by the corresponding sense amplifiers. Some of the sensed data are selected by a column decoder. When data is read out, data selected by the column decoder is externally output. When data is written in, new WRITE data is supplied to the column decoder.

When a highly increased voltage is supplied to selected word line 11R, the speed for reading data from a selected memory cell can be increased. Alternatively, the impedance of a transistor for selecting a memory cell may be decreased, thereby charging a capacitor, for data storage, with a voltage sufficiently close to the power source voltage.

FIG. 2 is a circuit diagram showing an example of voltage bootstrap circuit 13 shown in FIG. 1; and FIGS. 3A to 3D are timing charts explaining the operations of voltage bootstrap circuit 13. In the arrangement of FIG. 2, capacitor 21 is precharged, via n-channel MOS transistor 20 serving as a load, to a potential lower than positive power source voltage VDD, by gate threshold voltage VTH of MOS transistor 20. In this precharged state, when input signal IN (FIG. 3A) is set at a low potential (VSS) and the output of inverter 26 is set at a high potential, the potential of node N1 is increased by precharged capacitor 21, and is set at VDD+ΔV2 (where ΔV2 is a voltage sufficiently higher than gate threshold voltage VTH of MOS transistor 20) (FIG. 3C). N-channel MOS transistor 22 is turned on by the increased potential of node N1, and capacitor 23 is charged via MOS transistor 22 until node N2 is set at power source potential VDD (FIG. 3B). In this case, if output control signals CONT1 and CONT2 are at low and high potentials VSS and VDD, respectively, and n-channel MOS transistors 24 and 25 are turned off and on by signals CONT1 and CONT2, respectively, the potential of signal OUT at output node N3 becomes VSS (FIG. 3D).

When the potential of input signal IN is increased from VSS to VDD, the output potential of inverter 26 drops inversely from VDD to VSS. Then, the potential of node N1 is decreased from VDD+ΔV2 to VDD−VTH by the coupling of capacitor 21, thereby turning off MOS transistor 22.

In accordance with the output potential drop of inverter 26, the output potential of inverter 27 increases from VSS to VDD, and the potential of node N2 is increased from VDD to VDD+ΔV1 by the coupling of precharged capacitor 23. Meanwhile, in synchronism with the leading edge of input signal IN, the potential of output control signal CONT1 is increased from VSS to VDD, and then the signal line of signal CONT1 is set in a high impedance state. The potential of output control signal CONT2 drops from VDD to VSS in synchronism with the leading edge of input signal IN, thereby turning off MOS transistor 25. As a result, MOS transistor 24 is turned on, and the potential of node N2 is obtained, from output node N3, as output signal OUT. More specifically, when the line impedance of signal CONT1 is set at high level, the gate potential of MOS transistor 24 is increased by the coupling of capacitor 28, inserted between the gate of MOS transistor 24 and output node N3. This increased gate potential turns on MOS transistor 24, and the increased potential VDD+ΔV1 of node N2 is sent to output node N3, without modification of the potential.

Subsequently, when the potential of signal IN drops from VDD to VSS, the potentials of signals CONT1 and CONT2 are set at VSS and VDD, respectively, so that MOS transistors 24 and 25 are turned off and on, respectively. Then, the potential of node N3 drops to VSS, via MOS transistor 25. On the other hand, the output potentials of inverters 26 and 27 are set at VDD and VSS, respectively, and the potential of node N1 is increased again to VDD+ΔV2. As a result, MOS transistor 22 is turned on, so as to charge capacitor 23 to almost VDD.

After capacitor 23 is discharged, the potential of node N2 is decreased to about ($\frac{1}{2}$) to ($\frac{2}{3}$) VDD. The time period (t1 of FIG. 3B) required for increasing the potential of node N2 to about VDD is normally about 20 to 30 nsec at shortest, and depends on the element dimensions of MOS transistor 22.

In the conventional memory device shown in FIG. 1, when continuous data readout or data write-in is to be performed, a time interval of at least 20 to 30 nsec is required between two sequential operations which are adjacent in time, in order to fully charge capacitor 23. If such a time interval is not provided and the next operation is started without sufficiently charging the capacitor (23), the potential of word lines goes lower than a prescribed value, and the conductance of a MOS transistor for memory cell selection becomes small. Then, a sense amplifier is operated before a sufficient potential difference occurs in the bit lines, thereby causing an erroneous operation. Also, since the WRITE voltage of the capacitor for data storage decreases to a low level, the data-hold time decreases, resulting in accidental data erasure and/or an increased soft error rate. Therefore, while capacitor 23 is being charged, even if the other circuit elements are able to operate, the next operation of the circuit elements should not be started. Thus, one-operation cycle time is prolonged by the period (20 to 30 nsec) necessary for precharging capacitor 23. (First defect)

Recently, dynamic RAMs have been developed, which have an internal address counter, to enable an auto-refresh operation to be performed without the need for externally supplying an address signal. In such a RAM, a normal (or regular) data write/read operation (to be referred to hereinafter as a normal operation) and a refresh operation can be performed separately. In order to shorten the refresh time, it is proposed to divide the memory cell array into a number of groups (each consisting of several columns), and to drive more word lines (of each divided group) in a parallel manner, than in the normal operation. In this case, however, if a voltage bootstrap used in a conventional memory device is adapted, since the increased voltage actually applied to a word line is determined in accordance with a ratio of the capacitance of capacitor 23 to the parasitic capacitance on a path from output node N3 to the word line (FIG. 2), the following disadvantages arise. That is, when more word lines than in a normal operation are to be driven in a parallel manner, in a refresh operation, and if the capacitance of capacitor 23 is to be small, in consideration of the normal operation, the potential of the word line becomes insufficient during the refresh operation, resulting in accidental data erasure or an increased soft error rate.

On the other hand, if capacitor 23 has a large capacitance, in consideration of the refresh operation, the potential of the word line becomes unnecessarily high during the normal operation, thereby materially degrading the reliability of the gate oxide film of a selection MOS transistor in the memory cell, or of a MOS transistor in the row decoder. In other words, if the word line potential is unnecessarily high, the gate leakage of the MOS transistor is increased or the gate threshold level thereof is shifted to a high value, thereby degrading the transistor element. In a worst case situation, the gate is damaged. In this manner, in a conventional memory device, different numbers of word or bit lines cannot be driven in a parallel manner, in normal and refresh operations. (Second defect)

SUMMARY OF THE INVENTION

It is accordingly an object of the present invention to provide a semiconductor memory device which can perform a continuous data write/read operation at a high speed, and can shorten the time required for a refresh operation.

To achieve the above object, in the present invention, two or more voltage bootstrap circuits are provided, which are sequentially or alternately operated. Then, a continuous data write/read operation can be performed at a high speed. Further, when one of the two voltage bootstrap circuits is used for the data write/read operation and the other thereof is used for the refresh operation, the time required for refreshing can be shortened.

BRIEF DESCRIPTION OF THE DRAWINGS

FIG. 4 is a block diagram showing a semiconductor memory device with voltage bootstrap circuits, according to an embodiment of the present invention;

FIG. 5 is a block diagram showing a modification of FIG. 4;

FIG. 6 shows a practical circuit configuration of voltage bootstrap circuits (13A, 13B) shown in FIG. 4 or 5;

FIG. 7 shows a practical circuit configuration of an input signal switch (14) shown in FIG. 4 or 5;

PREFERRED EMBODIMENTS OF THE INVENTION

Figure 1:
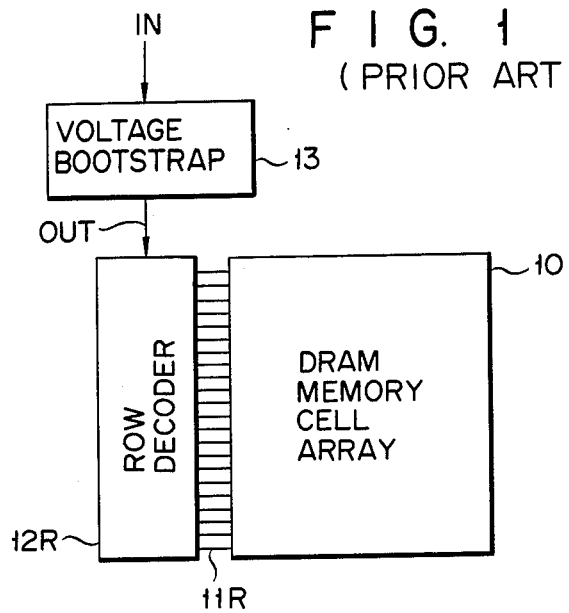
FIG. 1 is a block diagram schematically showing a conventional semiconductor memory device with a voltage bootstrap circuit.

An embodiment of the present invention will now be described with reference to the accompanying drawings.

FIG. 4 is a block diagram of a semiconductor memory device with two voltage bootstrap circuits, according to the present invention.

Referring to FIG. 4, reference numeral 10 denotes a dynamic memory cell array having a plurality of capacitive memory cells (not shown), in the same manner as in a conventional device. The memory cells in memory cell array 10 are connected to corresponding ones of a plurality of word lines 11R. Reference numeral 12R denotes a row decoder for selecting a specific one of word lines 11R in accordance with a given address signal (not shown). Row decoder 12R receives signal OUT whose voltage potential is increased, to a level higher than a power source voltage, by either first or second voltage bootstrap circuits 13A or 13B, respectively. Then, decoder 12R drives, using voltage-increased signal OUT, the word line 11R selected in accordance with the given address signal.

Input signal IN is supplied, as signal IN1 or IN2, to first or second voltage bootstrap circuits 13A or 13B, via input signal switch 14. Input signal switch 14 receives a RAS (row address strobe) signal, a control signal for auto-refreshing operation, or the like, as input signal IN. Which signal IN1 or IN2 is to be supplied from switch 14 to bootstrap circuit 13A or 13B is determined by the content (logic level) of selection data SD. Each of first and second voltage bootstrap circuits 13A and 13B increases the voltage of the power source when the levels of input signals IN1 and IN2 change, and outputs the increased voltage as signal OUT.

In FIG. 4, voltage-increased signal OUT is input to row decoder 12R. On the other hand, FIG. 5 shows a case wherein signal OUT is input to column decoder 12C. More specifically, decoder 12C includes switching MOS transistors (not shown) respectively connected to bit lines 11C and to I/O ports (not shown). Voltage increased signal OUT is applied to the gate of one of the switching MOS transistors, which is selected by an address signal (not shown) of memory cell array 10.

FIG. 6 is a circuit diagram showing a practical arrangement of first and second voltage bootstrap circuits 13A and 13B shown in FIG. 4 or 5. Both voltage bootstrap circuits 13A and 13B have the same arrangement as the voltage bootstrap circuit shown in FIG. 2, except for MOS transistor 25. In first voltage bootstrap circuit 13A, portions corresponding to those in the circuit of FIG. 2 are indicated by the same reference numerals, with suffixes A added thereto.

Figure 2:
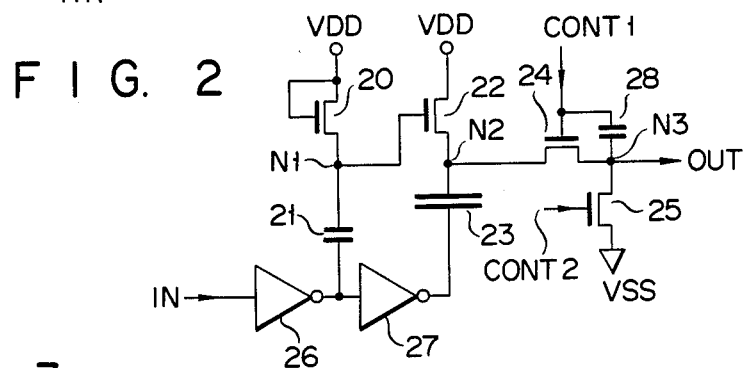
FIG. 2 is a circuit diagram (not prior art) which can be used for an internal arrangement of the voltage bootstrap circuit shown in FIG. 1.

In second voltage bootstrap circuit 13B, portions corresponding to those in the circuit of FIG. 2 are indicated by the same reference numerals, with suffixes B added thereto. Respective output nodes N3A and N3B of first and second voltage bootstrap circuits 13A and 13B, which deliver signal OUT, are commonly connected to output node N3C, to which MOS transistor 25 is also connected. The gate of MOS transistor 25 receives output control signal CONT2 which is anti-phased to input signal IN. The gates of MOS transistors 24A and 24B, in first and second voltage bootstrap circuits 13A and 13B, receive output control signals CONT11 and CONT22, respectively. Inverters 26A and 26B of voltage bootstrap circuits 13A and 13B receive input signals IN1 and IN2, respectively.

FIG. 7 is a circuit diagram showing a practical arrangement of input signal switch 14. Switch 14 comprises a pair of AND gates 14A and 14B, and T-type flip-flop 141. The first inputs of gates 14A and 14B receive input signal IN. The second input of gate 14A receives a Q output from flip-flop 141. The second input of gate 14B receives an inverted $\overline{Q}$ output from flip-flop 141. Flip-flop 141 constantly receives a logic "1"-level signal (VDD) at the T input. Flip-flop 141 also receives, as a clock input (gate selection data SD), clock pulse having a period corresponding to one data write/read operation.

The memory device of FIGS. 6 and 7 having the above configuration can increase the speed of a continuous data write/read operation. The operation of this memory device will now be described using the timing charts of FIGS. 8A to 8F.

In the circuit of FIG. 7, every time the clock pulse is supplied, the logic levels of Q and inverted $\overline{Q}$ outputs 141 are alternately changed. Therefore, input signal IN (FIG. 8A) alternately passes either one of AND gates 14A and 14B, and signal IN1 (FIG. 8B) and signal IN2 (FIG. 8C) are alternately set at logic level "1".

Figure 8:
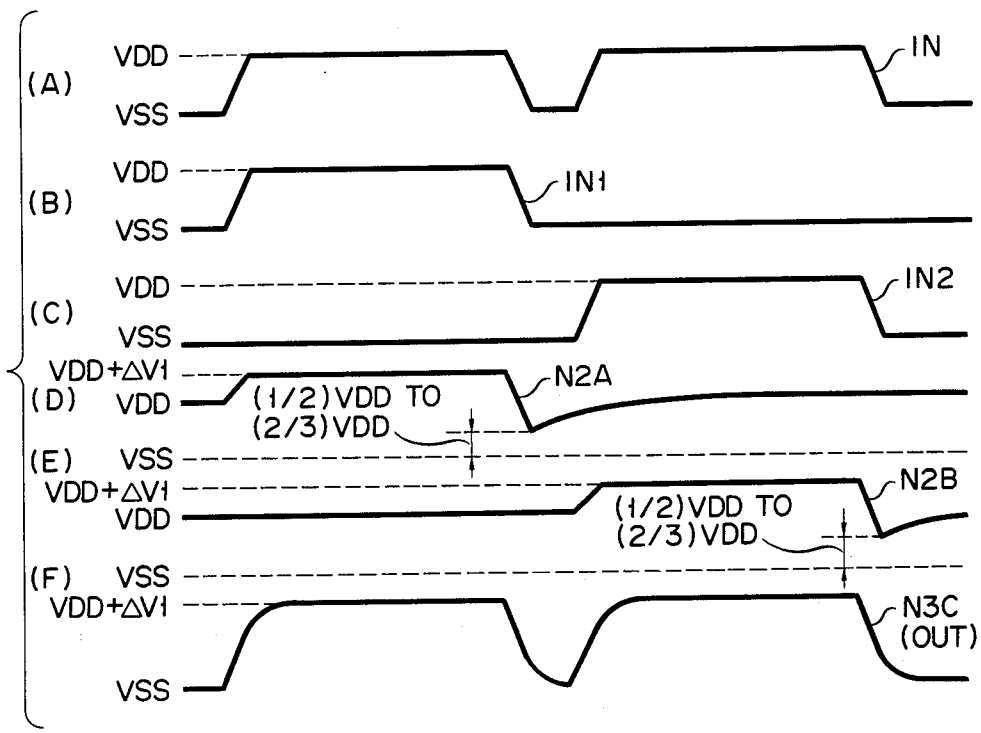
FIGS. 8A to 8F are timing charts for explaining the circuit operation of FIG. 6.

Assume that signal IN is set at logic level "1" at a certain timing, so that signal IN1 is set at logic level "1". Then, first voltage bootstrap circuit 13A is operated in response to signal IN1, and a potential, increased to VDD+ΔV1, can be obtained at its internal node N2A (FIG. 8D), in the same manner as in FIG. 2. The potential of output control signal CONT2 drops from VDD to VSS, in synchronism with the leading edge of signal IN, thereby turning off MOS transistor 25. The potential of output control signal CONT11 is increased from VSS to VDD, in synchronism with the leading edge of signal IN1, and the line impedance of signal CONT11 is set at high level. Then, MOS transistor 24A is turned on first, and the potential of node N2A is sent to common output node N3C (FIG. 8F).

When the line impedance of signal CONT11 is set in a high impedance state, the gate potential of MOS transistor 24A is increased by the coupling of capacitor 28A, and MOS transistor 24A becomes conductive (but MOS transistor 24A is not saturated). The increased potential VDD+ΔV1 of node N2A is output to common output node N3C, with no modifications in potential.

When input signal IN is set at logic level "0", MOS transistors 24A and 25 are turned off and on, respectively. Therefore, the potential of common node N3C is decreased to VSS. In this case, the output potential of inverter 27A is inverted from VDD to VSS, the potential of node N2A is decreased from VDD+ΔV1 to ($\frac{1}{2}$) to ($\frac{2}{3}$) VDD, and capacitor 23A is thus charged via MOS transistor 22A.

When input signal IN is set at logic level "1", by the next clock timing of clock φ (FIG. 7), signal IN2 is set at logic level "1", thereby operating second voltage bootstrap circuit 13B. Thereafter, a potential, increased to VDD+ΔV1, is obtained at node N2B (FIG. 8E), and the correspondingly increased potential is obtained from common output node N3C. During this operation, capacitor 23A, in first voltage bootstrap circuit 13A, is being charged. This charging is completed while second voltage bootstrap circuit 13B is operating.

In this manner, one circuit (13A) completes preparation (precharging of capacitor 23A) for the next operation, while the other circuit (13B) is operating. This is a major feature of the embodiment of FIG. 6.

Figure 3:
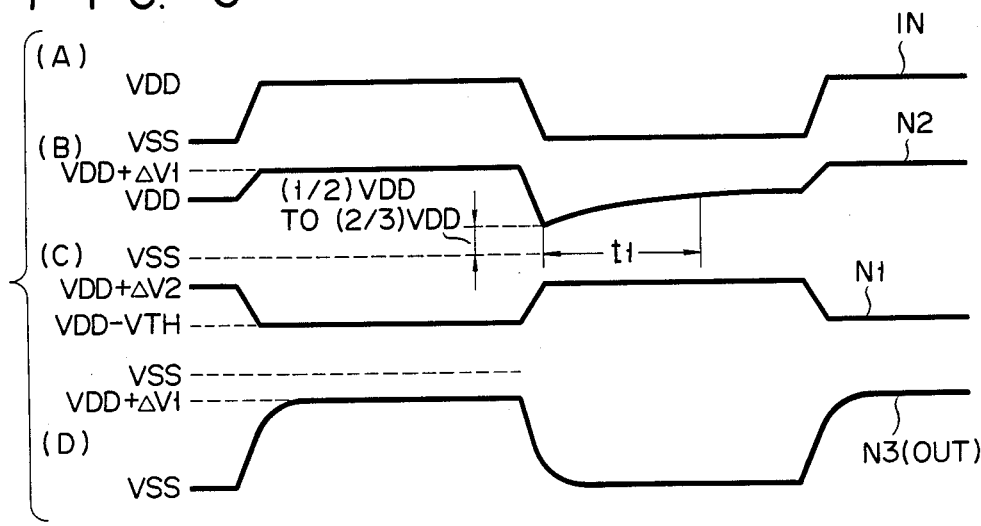
FIGS. 3A to 3D are timing charts for explaining the circuit operation of FIG. 2.

Similarly, first and second voltage bootstrap circuits 13A and 13B are operated alternately, thereby shortening the period required for obtaining the voltage-increased signal (OUT at node N3C), to about half that shown in FIG. 3D.

As is described above, since one of first and second bootstrap circuits 13A and 13B charges capacitor 23A or 23B while the other is operating, the time loss which is unavoidable for a prior art device, in order to complete the charging of capacitor 23A or 23B, can be eliminated according to the embodiment of this invention. Therefore, the operation cycle time can be shorter than in a conventional device, thus enabling the device to operate at a high speed.

Figure 9:
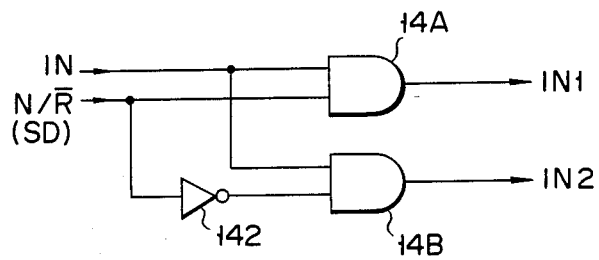
FIG. 9 is a circuit diagram showing a modification of FIG. 7.

FIG. 9 is a circuit diagram of a modification of input signal switch 14 shown in FIG. 7. Switch 14 in FIG. 9 can be used in place of that in FIG. 7, when the time for the refresh operation of the memory device is required to be shortened. Switch 14 comprises a pair of AND gates 14A and 14B, and inverter 142. The first inputs of gates 14A and 14B receive input signal IN. The second input of gate 14A receives switching signal N/$\overline{R}$ as selection data SD. Signal N/$\overline{R}$ is set at logic level "1" for the normal (or regular) operation, and at logic level "0" for the refresh operation. The second input of gate 14B receives signal N/$\overline{R}$ via inverter 142.

According to the circuit configuration of input signal switch 14 shown in FIG. 9, input signal IN is output through gate 14A as input IN1, during the normal operation, and through gate 14B as signal IN2, during the refresh operation. In this case, first and second voltage bootstrap circuits 13A and 13B can be exclusively used for the normal and refresh operations, respectively.

When the capacitance of capacitor 23B of second bootstrap circuit 13B is higher than that of capacitor 23A of first bootstrap circuit 13A, a larger number of word lines can be simultaneously driven in the refresh operation than in the normal operation. Further, if the DRAM is divided into a prescribed number of columns, more memory cells can be refreshed by one refresh operation, so that the time required for refreshing is shortened.

When the normal operation is to be performed, only one word line, at minimum, need be driven. Therefore, first bootstrap circuit 13A for the normal operation can use capacitor 23A having a relatively small capacitance, thereby reducing power consumption.

In this manner since signal switch 14 switches input signal IN in the normal and refresh operations, first and second voltage bootstrap circuits 13A and 13B can be designed with an optimum configuration for the normal and refresh operations, respectively.

Figure 10:
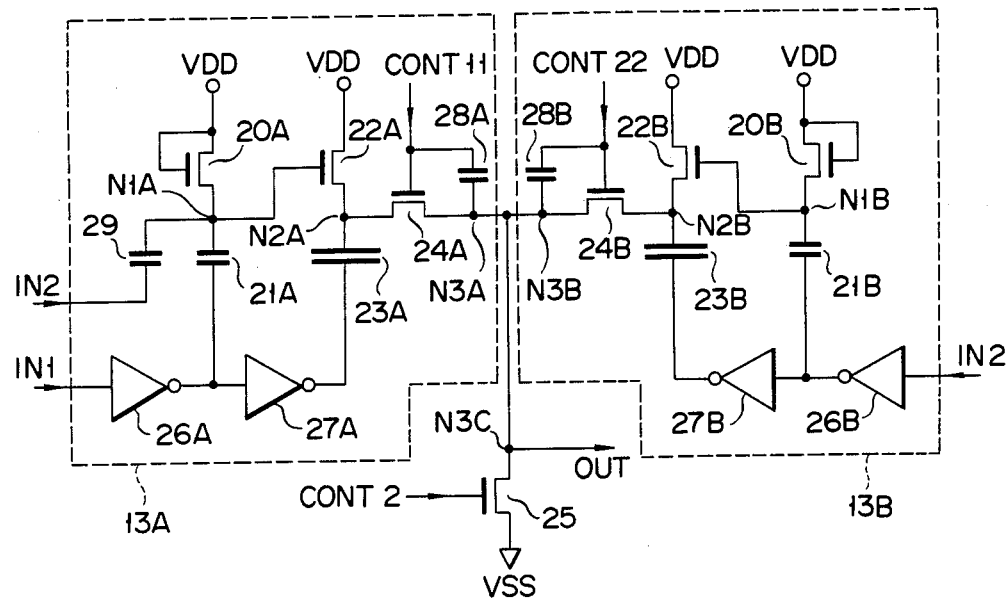
FIG. 10 is a circuit diagram showing a modification of FIG. 6.

In the above embodiment, when first and second bootstrap circuits 13A and 13B are exclusively used for the normal and refresh operations, respectively, and if only the refresh operation is performed and the normal operation is not performed for a long period of time, node N1A of bootstrap circuit 13A for the normal operation, is left unused for a long period of time. In this case, the potential of node N1A gradually decreases to VDD or less, due to current leakage. Then, node N2A can be charged to a potential of VDD−VTH at most. If first bootstrap circuit 13A is operated in this condition, a sufficiently increased voltage cannot be obtained at output node N3A, thus hindering the effect of the present invention. (Although the embodiment of FIG. 6 could involve this drawback, this embodiment is still advantageous over the prior art configuration shown in FIG. 1.) In this case, as is shown in the embodiment of FIG. 10, one end of capacitor 29 is connected to node N1A of first bootstrap circuit 13A for normal operation, and input signal IN2, to be supplied to second bootstrap circuit 13B, is supplied to the other end of capacitor 29.

With this arrangement, even if a normal operation is not performed for a long period of time, and node N1A of first bootstrap circuit 13A for normal operation is left unused for a long period of time, since the electrical coupling of capacitor 29 is effected, the potential of node N1A can be increased by signal IN2 every time a refresh operation is performed. This capacitor coupling renders MOS transistor 22A to be turned on, and capacitor 23A is charged therethrough, thereby eliminating the above drawback.

Incidentally, the circuit shown in the aforementioned T. Nakano et al, "A Sub-100 ns 256K DRAM. with Open Bit Line Scheme" IEEE Journal of Solid-State Circuits, Vol. SC-18, No. 5 (October 1983), p. 454, FIG. 9, can be used as voltage bootstrap circuit 13A (13B) of the present application.

Figure 11:
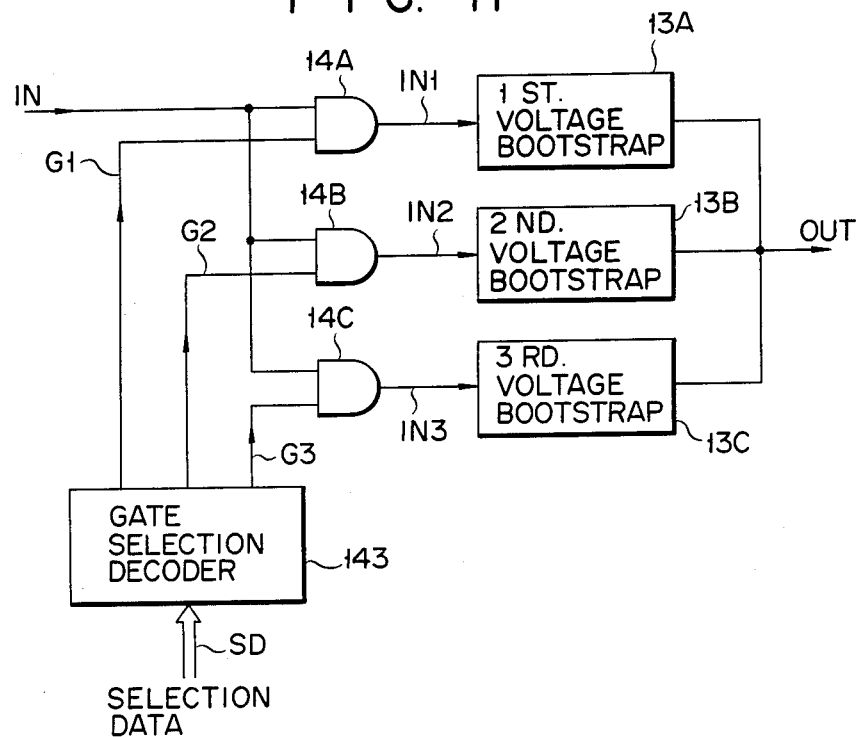
FIG. 11 is a circuit diagram of an input signal switch (14) showing a case wherein the number of bootstrap circuits is 3.

FIG. 11 shows a case wherein the number of voltage bootstrap circuits, as shown in FIG. 4 or 5, is three. Referring to FIG. 11, input signal IN is supplied to the first inputs of three AND gates 14A, 14B, and 14C. The second inputs of gates 14A, 14B, and 14C receive gate selection signals G1, G2, and G3, respectively, from gate selection decoder 143. Only one of signals G1 to G3 is set at logic level "1" in accordance with the contents of selection data SD, and the remaining two are set at logic level "0". In other words, only one of gates 14A, 14B, and 14C is opened, and the remaining two are closed. Outputs IN1, IN2, and IN3 of gates 14A, 14B, and 14C are input to first, second, and third voltage bootstrap circuits 13A, 13B, and 13C, respectively.

With the configuration of FIG. 11, since only one of gates 14A, 14B, and 14C is opened, only one bootstrap circuit is operated in response to input signal IN. While this specific bootstrap circuit is operating, the remaining two bootstrap circuits are on standby. For example, assume that the required standby time of each of bootstrap circuits 13A, 13B, and 13C is 30 nsec. Then, after bootstrap circuit 13A completes its operation, bootstrap circuit 13B operates for 15 nsec and next, bootstrap circuit 13C operates for 15 nsec. Then, standby of bootstrap circuit 13A is completed at this point of time. In this manner, if the number of bootstrap circuits, which are selectively operated, is increased, the operation time (15 nsec) of each individual bootstrap circuit can be reduced to be shorter than the corresponding standby time (30 nsec).

When four or more voltage bootstrap circuits are used, the number of output bits (G) of gate selection decoder 143 may be set to four or more, and the number of the AND gates (14) and bootstrap circuits (13) may each be set to be four or more.

As is described above, in the semiconductor memory device according to the present invention, a high-speed continuous data write/read operation can be performed, and the time required for a refresh operation can be shortened, compared to a conventional device.

While the invention has been described in connection with what is presently considered to be the most practical and preferred embodiment, it is understood that the invention is not to be limited to the disclosed embodiment but, on the contrary, is intended to cover various modifications and equivalent arrangements included within the spirit and scope of the appended claims, which scope is to be accorded the broadest interpretation, so as to encompass all such modifications and equivalent structures.

What is claimed is:

1. A semiconductor memory device having a power source and a plurality of input lines, comprising:
   a memory cell array having a plurality of memory cells;
   selection lines for selecting the memory cells in said memory cell array;
   a selection circuit means for selectively driving said selection lines;
   at least first and second voltage bootstrap circuits for supplying said selection circuit means with an increased voltage; and
   control means for controlling said first and second voltage bootstrap circuits to operate alternately in accordance with input signals supplied via said plurality of input lines.

2. A semiconductor memory device having a power source and a plurality of input lines, comprising:
   a memory cell array having a plurality of dynamic memory cells for performing write and read operations, said cells requiring a refresh operation;
   selection lines for selecting the memory cells in said memory cell array;

a selection circuit means for selectively driving said selection lines;

at least first and second voltage bootstrap circuits for supplying said selection circuit means with an increased voltage; and control means for operating said first voltage bootstrap circuit during said data write and read operations of said memory cell, and operating said second voltage bootstrap circuit during said refreshing of said memory cells, in accordance with input signals supplied via said plurality of input lines.

3. A device according to claim 1, wherein said control means includes means for operating said first voltage bootstrap circuit during a first operation period and operating said second voltage bootstrap circuit during a second operation period where lengths of said operation periods are independent of one another.

4. A device according to claim 2, wherein said first voltage bootstrap circuit includes a first capacitor for supplying said increased voltage, and said second voltage bootstrap circuit includes a second capacitor for supplying said increased voltage, the capacitance of said second capacitor being greater than the capacitance of said first capacitor.

5. A device according to claim 1, wherein each of said voltage bootstrap circuits comprises:
a first inverter for receiving one of said input signals via one of said input lines and having an output;
a first capacitor having a first and a second end, said first end connected to said output of said first inverter;
a first node connected to said second end of said first capacitor;
a load transistor connected to said first node and said power source;
a second inverter having an input connected to said output of said first inverter and having an output;
a second capacitor having a first and a second end, said first end connected to said output of said second inverter;
a second node, connected to said second end of said second capacitor, for providing a potential corresponding to said increased voltage; and
a transistor having a current path, connected to said second node, said power source, and a control gate connected to said first node.

6. A device according to claim 2, wherein each of said voltage bootstrap circuit comprises:
a first inverter for receiving one of said input signals via one of said input lines and having an output;
a first capacitor having a first and a second end, said first end connected to said output of said first inverter;
a first node connected to said second end of said first capacitor;
a load transistor connected to said first node and said power source;
a second inverter having an input connected to the output of said first inverter and having an output;
a second capacitor having an first and a second end, said first end connected to said output of said second inverter;
a second node, connected to said second end of said second capacitor, for providing a potential corresponding to said increased voltage, and
a transistor having a current path connected to said second node, said power source, and a control gate connected to said first node.

7. A device according to claim 5, wherein said input signal of said second voltage bootstrap circuit is also supplied to said first node of said first voltage bootstrap circuit, via a capacitor.

8. A device according to claim 6, wherein said input signal of said second voltage bootstrap circuit is also supplied to said first node of said first voltage bootstrap circuit, via a capacitor.

9. A device according to claim 5, wherein said second capacitor included in said second voltage bootstrap circuit is charged while said first voltage bootstrap circuit supplies the increased voltage to said selection circuit, and said second capacitor included in said first voltage bootstrap circuit is charged while said second voltage bootstrap circuit supplies the increased voltage to said selection circuit.

10. A device according to claim 6, wherein said second capacitor included in said second voltage bootstrap circuit is charged while said first voltage bootstrap circuit supplies the increased voltage to said selection circuit, and said second capacitor included in said first voltage bootstrap circuit is charged while said second voltage bootstrap circuit supplies the increased voltage to said selection circuit.

11. A device according to claim 6, wherein a capacitance of said second capacitor included in said second voltage bootstrap circuit is larger than a capacitance of the second capacitor included in said first voltage bootstrap circuit.

12. A semiconductor memory device having a power source and a plurality of input lines, comprising:
a memory cell array having a plurality of dynamic memory cells which require refreshing and are capable of data write and read operations;
selection lines for selecting the memory cells in said memory cell array;
selection circuit means for selectively driving said selection lines;
a first voltage bootstrap circuit, responsive to a first input signal on said input lines, for supplying said selection circuit means with a first increased voltage during a first operation period to perform data read and write operations of said memory cells; and
a second voltage bootstrap circuit, responsive to a second input signal on said input lines, for supplying said selection circuit means with a second increased voltage during a second operation period independent of said first operation period to refesh said memory cells.

13. A device according to claim 12, wherein each of said first and second voltage bootstrap circuits comprises:
a first inverter for receiving one of said input signals via one of said input lines and having an output;
a first capacitor having a first and a second end, said first end connected to said output of said first inverter;
a first node connected to said second end of said first capacitor;
a load transistor connected to first node and said power source;
a second inverter having an input connected to said output of said first inverter and having an output;
a second capacitor having a first and a second end, said first end connected to said output of said second inverter;

a second node, connected to said second end of said second capacitor, for providing a potential corresponding to said increased voltage; and a transistor having a current path connected to said second node, said power source, and a control gate connected to said first node.

14. A device according to claim 13, wherein said input signal of said second voltage bootstrap circuit is also supplied to said first node of said first voltage bootstrap circuit, via a capacitor.

15. A device according to claim 13, wherein said second capacitor included in said second voltage bootstrap circuit is charged while said first voltage bootstrap circuit supplies the increased voltage to said selection circuit, and said second capacitor included in said first voltage bootstrap circuit is charged while said second voltage bootstrap circuit suppplies the increased voltage to said selection circuit means.

16. A device according to claim 13, wherein a capacitance of said second capacitor included in said second voltage bootstrap circuit is larger than a capacitance of said second capacitor included in said first voltage bootstrap circuit.

17. A device according to claim 12, wherein said control means includes means for operating said first voltage bootstrap circuit during a first operation period and operating said second voltage bootstrap circuit during a second operation period where lengths of said operation periods are independent of one another.

18. A device according to claim 12, wherein said first voltage bootstrap circuit includes a first capacitor for supplying said increased voltage, and said second voltage bootstrap circuit includes a second capacitor for supplying said increased voltage, the capacitance of said second capacitor being greater than the capacitance of said first capacitor.

* * * * *